United States Patent [19]

Wolfe, Jr.

[11] Patent Number: 4,549,921

[45] Date of Patent: Oct. 29, 1985

[54] LAMINATION OF FLUOROCARBON FILMS

[75] Inventor: William R. Wolfe, Jr., Wilmington, Del.

[73] Assignee: E. I. Du Pont de Nemours and Company, Wilmington, Del.

[21] Appl. No.: 546,546

[22] Filed: Oct. 28, 1983

[51] Int. Cl.$^4$ .................. B29C 19/02; B29C 19/06; C09J 5/02
[52] U.S. Cl. .................. 156/272.6; 156/229; 156/275.7; 156/307.3; 156/331.4; 156/333; 428/421; 428/422; 525/121; 526/254
[58] Field of Search .............. 156/272.6, 275.7, 307.3, 156/331.4, 333, 229; 428/421–422, 910; 526/254; 525/121

[56] References Cited

U.S. PATENT DOCUMENTS

| | | | |
|---|---|---|---|
| 3,025,185 | 3/1962 | Schmidt | 117/138.8 |
| 3,111,450 | 11/1963 | Stevens | 156/331.7 |
| 3,382,215 | 5/1968 | Baum | 156/331.4 |
| 3,513,064 | 5/1970 | Westley | 161/92 |
| 3,950,471 | 4/1976 | Stastny | 264/112 |
| 4,076,652 | 2/1978 | Ganci et al. | 252/505 |
| 4,125,491 | 11/1978 | Gorman | 524/507 |
| 4,232,608 | 11/1980 | Wrightson | 156/331.4 |
| 4,335,238 | 6/1982 | Moore et al. | 428/421 |

Primary Examiner—Edward Kimlin
Assistant Examiner—Merrell C. Cashion, Jr.

[57] ABSTRACT

Surface treated oriented fluorocarbon films can be laminated to substrates using an adhesive composition of a selected copolymer of vinylidene fluoride and hexafluoropropylene and a selected diisocyanate curing agent in an organic solvent.

1 Claim, No Drawings

LAMINATION OF FLUOROCARBON FILMS

BACKGROUND

Oriented films of melt-fabricable fluorocarbon copolymers are frequently bonded or laminated to one another or to other substrates in order to provide composites or laminates for use in printed circuits, flat electrical cable, corrosion protection and anti-stick surfacing. However, many adhesives, such as silicones, acrylics or polyesters, do not bond adequately to oriented fluorocarbon films. A strong adhesive is desirable to achieve good bonding or lamination. In this invention, such an adhesive is described.

SUMMARY OF THE INVENTION

In this invention, oriented melt-fabricable fluorocarbon copolymer films are laminated to one another or to a substrate by first treating the surface of each film to be laminated to corona discharge in an atmosphere of acetone, then coating the surface of each such film with an adhesive mixture of:

A. 5–40% by weight of a copolymer of about 30 to 70% by weight of vinylidene fluoride units and complementally about 70 to 30% by weight of hexafluoropropene units, and B. 0.5–3% by weight of an isocyanate condensation product made from 1 mole trimethylolpropane and 3 moles toluene diisocyanate in C. sufficient organic solvent for both A and B to make the mixture components total 100%, and then placing the coated film against another such film or against a substrate, and heating for at least for 1.5 minutes at from 150° to 175° C. at a pressure of from 8 to 12 psi.

The adhesive mixture is also a part of this invention.

DESCRIPTION

By the term "fluorocarbon copolymer films" is meant films of melt-fabricable copolymers formed by copolymerization of tetrafluoroethylene with at least one other ethylenically unsaturated comonomer. Useful comonomers include those of the formulae $R_f\text{-}(CF_2)_n\text{-}CF=CF_2$, or $R_f\text{-}O\text{-}(CF_2)_n\text{-}CF=CF_2$, or

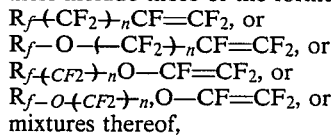

mixtures thereof, wherein n is a cardinal number of 0–10 inclusive and n' is a cardinal number of 1–10, and $R_f$ is perfluorinated alkyl of 1 to 8 carbon atoms inclusive or ω—hydroperfluorinated alkyl of 1 to 8 carbon atoms, inclusive. Preferably $R_f$ is perfluorinated alkyl of 1 to 8 carbon atoms inclusive. Preferred comonomers of these classes include ones selected from the group consisting of perfluoro(alkyl vinyl ethers) where the alkyl group has 1 to 18 carbon atoms, [These have the formula—$R_f(CF_2)_nO\text{—}CF=CF_2$]; perfluoroalkene comonomers having 3 to 18 carbon atoms [these have the formula $R_f(CF_2)_n\text{—}CF=Cf_2$]; or any combination of these comonomers.

Most preferred are those copolymers formed by the copolymerization of tetrafluoroethylene with 5 to 15% hexafluoropropylene or 0.4 to 5% perfluoro(alkyl vinyl ether), or a combination of these comonomers to form a terpolymer (as used herein, percentages of comonomer are in mole percent). The crystalline melting point of these copolymers depends upon the amount of comonomer present. Generally speaking, the more such comonomer present, the lower the crystalline melting point.

The term "fluorocarbon copolymer films" also includes films of copolymers of ethylene with tetrafluoroethylene or chlorotrifluoroethylene and, optionally, a minor amount of at least one other copolymerizable monomer. The copolymer of ethylene and tetrafluoroethylene is disclosed in U.S. Pat. No. 2,468,664 to Hanford and Roland. These copolymers can be prepared by the non-aqueous polymerization of U.S. Pat. No. 3,528,954. The copolymer of ethylene and chlorotrifluoroethylene is disclosed in U.S. Pat. No. 2,392,378 to Hanford and is preferably prepared in a nonaqueous polymerization system. With respect to these copolymers, from 40 to 60 mole percent of ethylene is ordinarily present and, preferably, complementary to total 100 mole percent, from 40 to 60 mole percent of tetrafluoroethylene or chlorotrifluoroethylene is present.

In order to be melt fabricable, all the copolymers used in this invention should be of film forming melt viscosities, generally having specific melt viscosities of no greater than about $5 \times 10^6$ poises ($5 \times 10^5$ Pa s) measured at a shear stress of 0.455 kg/cm² (0.045 MPa), at 300° C. for the tetrafluoroethylene copolymers and at 260° C. for the chlorotrifluoroethylene copolymers.

The optional minor amounts of one or more copolymerizable monomers that may be present in the copolymers useful in the practice of the subject invention are vinyl monomers which are free of telogenic activity, i.e., they must not act as a chain transfer agent to an extent which undesirably limits the molecular weight of the copolymer. By "copolymerizable" is meant that the monomer is able to form an integral part of the main copolymer chain and must not act as an inhibitor to prevent the copolymerization reaction from occurring. These monomers may also include other compounds that will copolymerize such as halogenated ketones, e.g. those of the formula $$X\text{—}CF_2\text{—}\underset{\underset{O}{\|}}{C}\text{—}CF_2\text{—}X'$$

wherein X and X' are selected from the group consisting (1), individually, of hydrogen, fluorine, chlorine and bromine, perfluoroalkyl, ω-hydro-, ω-chloro-, or ω-bromo, perfluoroalkyl of up to 18 carbons and (2), jointly, of haloperfluoroalkylene of 1–3 carbons.

These optional minor amount monomers include those of the formulas $R\text{—}CF=CF_2$ and $ROCF=CF_2$ wherein R is a hydrocarbyl organic group which can be cyclic, acyclic and/or contain an aromatic nucleus and which contains from 2 to 8 carbon atoms. Generally, the organic group will be highly fluorinated, i.e., at least one fluorine atom substituted on each carbon atom. However, other atoms can be present such as chlorine as monosubstituents on a carbon atom.

The R group need not be highly fluorinated where some sacrifice in thermal stability of the resulting copolymer can be tolerated. Examples of monomers not highly fluorinated and useful in the present invention include the hydrofluorocarbon fluorinated vinyl monomers and hydrocarbon fluorinated vinyl monomers, such as of the formulas $CF_3(CF_2)_mCH_2OCF=CF_2$, where m is an integer of 0 to 6 and $CH_3(CH_2)_nOCF=CF_2$, where n is an integer of 1 to 7, respectively. These vinyl ethers are made by reacting the respective sodium alcoholate with tetrafluoroethylene under conditions disclosed in U.S. Pat. No. 3,159,609. Examples of these vinyl ethers include n-butyltrifluorovinyl ether and 2,2,3,3,3-pentafluoropropyl trifluorovinyl ether.

Fluorinated-alkyl ethylenes can be employed as the optional minor component. They generally have the formula $R_f$—CH=CH$_2$ where $R_f$ is perfluoroalkyl of 1-10 carbons or ω-substituted perfluoroalkyl.

Representative optional vinyl monomers that can be used include the fluorinated α-olefins such as perfluorobutene-1, perfluoropentene-1, perfluoroheptene-1, omegahydroperfluorooctene-1 and perfluorobutyl ethylene, and the fluorinated vinyl ethers represented by the formula XCF$_2$(CF$_2$)$_n$OCF=CF$_2$ wherein X is F, H or CL and n is an integer of 1 to 7. Examples of such vinyl ethers include perfluoro(ethyl vinyl ether), perfluoro(propyl vinyl ether), and 3-hydroperfluoro(propyl vinyl ether). Another fluorinated vinyl ether that can be used is perfluoro(2-methylene-4-methyl-1,3-dioxolane) which is described in U.S. Pat. No. 3,308,107 to Selman and Squire.

Examples of vinyl monomers in which the side chain is aromatic include perfluorostyrene, pentafluorostyrene, and α, β,β-trifluorostyrene.

Additional vinyl monomers in which the vinyl group is hydrocarbon and which are useful in the present invention can be represented by the formulae

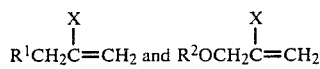

wherein R$^1$ and R$^2$ are perfluorinated or chlorofluoroalkyl groups of 1 to 7 carbon atoms and X is H or CH$_3$. The simplest of these vinyl monomers are prepared by reacting hexafluoroacetone with propylene in the presence of AlCl$_3$ and hexafluoroacetone with allyl bromide in the presence of CsF, respectively. Further description of vinyl monomers of these formulae and process for making them is provided in Knunyants, Bull. Acad. Sci., USSR, Div. Chem. Sci., 355 (1 962) and Dutch Pat. No. 6,602,167. Typical R$^1$ and R$^2$ groups for these monomers include the perfluoroalkyls such as CF$_3$CF$_3$CF$_2$—, and (CF$_3$)$_2$CF— and the chlorofluoroalkyls such as (CClF$_2$)$_2$CF. R$^1$ can also be a secondary or tertiary halo-alcohol such as of the group —(CClF$_2$)$_2$COH, or —(CF$_3$)$_2$COH, such as described in U.S. Pat. No. 3,444,148. Examples of these vinyl monomers are as follows: 4,4,4-trifluorobutene-1; 3,3,3-trifluoropropylene; 4,4,5,5,5-pentafluoropentene-1; 1,1,1-trifluoro-2-(trifluoromethyl)-4-penten-2-ol; 1-chloro, 1,1-difluoro-2-(chlorodifluoromethyl)-4-penten-2-ol; 1,1,1-trifluoro-2-(trifluoromethyl)-4-methyl-4-penten-2-ol; 4-(trifluoromethyl)-4,5,5,5-tetrafluoropentene-1; allyl heptafluoroisopropyl ether; allyl-1,3-dichloropentafluoroisopropyl ether; allyl heptafluoropropyl ether; allyl pentafluoroethyl ether and 2-methyl allyl heptafluoroisopropyl ether.

By "minor amount" of additional monomer is meant 0.1 to 10 mole %, preferably less than 3 mole of monomer based on total polymer. These monomers are generally randomly interspersed among the ethylene and the tetrafluoroethylene or chlorotrifluoroethylene units.

The formation of fluorocarbon copolymer films is well known in the art. Generally speaking, the polymer is extruded in melt form from an orifice and quenched to well below its melting point. The extrusion orifice can be such that the film produced is in flat sheet or tubular form. The film thickness will generally be between 0.5 and 100 mils before stretching and between 0.05 and 20 mils after stretching. If tubular film is to be stretched in accordance with the subject invention, the tube may first be collapsed and laid flat, or be slit and opened into flat sheet form.

The films that are used herein are oriented, i.e. they are subjected to known stretching procedures. By the term "oriented" is meant that the films are stretched in at least one direction at least 1.1. Any method of orientation may be used to obtain oriented films. For example, the films can be longitudinally stretched between heated rolls turning at different speeds or elongated by a calendering process.

To prepare the surfaces of the films for coating, a corona discharge treatment is carried out.

Corona discharge is produced by capacitatively exchange a gaseous medium which is present between two spaced electrodes, at least one of which is insulated from the gaseous medium by a dielectric barrier. Corona discharge is limited in origin to alternating currents because of its capacitative nature. It is a high voltage, low current phenomenon with voltages being typically measured in kilovolts and currents being typically measured in milliamperes. Corona discharges may be maintained over wide ranges of pressure and frequency. Pressures of from 0.2 to 10 atmospheres generally define the limits of corona discharge operation and atmospheric pressures generally are preferred. Frequencies ranging from 20 Hz. to 100 mHz. can conveniently be used: preferred frequently ranges are from 500, especially 3000, Hz. to 10 mHz.

When dielectric barriers are employed to insulate each of two spaced electrodes from the gaseous medium, the corona discharge phenomenon is frequently termed an electrodeless discharge, whereas when a single dielectric barrier is employed to insulate only one of the electrodes from the gaseous medium, the resulting corona discharge is frequently termed a semi-corona discharge. The term "corona discharge" is used throughout this specification to denote both types of corona discharge, i.e. both electrodeless discharge and semi-corona discharge.

The effect of exposing the polymeric substrate to the electrical discharge is not fully understood. It appears possible, however, that some form of chemical activation of the surface takes place at the same time as does some attrition of the substrate. The surface activation apparently provides bonding sites for the coating of the condensation polymer but the nature of the bond is not known.

The corona-treated oriented melt-fabricable fluorocarbon copolymer films are coated on the heated side with the adhesive mixture which is prepared simply by mixing components A, B, and C as defined hereinbefore. The solvent component C can be acetone, tetrahydrofuran methylethyl ketone, ethyl acetate, isopropyl acetate or propyl acetate. The adhesive mixture is applied by any suitable means, e.g., spraying, dipping, brushing, etc., to the corona treated surface.

The sides of the coated films, or the cooled film and the substrate to be laminated to the film, are then brought together under a pressure of 8-12 psi and a temperature of 150 to 175 for at least 1.5 minutes.

EXAMPLES

Adhesion strengths were measured in a tensine test according to ASTM D1876 "Peel Resistance of Adhesives (T-Peel Test)" modified to a crosshead speed of 2 in (5.08 cm)/min which is standard speed used for fluorocarbon film.

EXAMPLE 1

The oriented films described below (identified as Films 1, 2 and 3) were machine direction oriented between heated rolls turning at different speeds, and were then corona treated in the presence of acetone vapor in a laboratory scale corona treating unit. The 21.6 kilohertz input power was 125 watts with a 40 mil electrode gap. The oxygen concentration in the $N_2$ blanket was 3.0-7.5 ppm. The electrode area was flooded with acetone vapors. Such treatment produced a surface on the films that is receptive to adhesives.

Film to film bonds were made from the films using three commercial adhesives for comparison (namely, a silicone, an acrylic and a cured polyester;) and using a vinylidene fluoride/hexafluoropropylene adhesive of this invention. Film to aluminum bonds were also made using a commercial acrylic adhesive. The seal strength of the bonds were measured using ASTM D1876 "Peel Resistance of Adhesive (T-Peel Test)" as modified hereinabove.

The commercial acrylic bond was made by coating aluminum sheet with a commercial acrylic adhesive (made of a copolymer of methyl methacrylate, butyl methacrylate & glycidyl methacrylate) and allowing it to air dry for 8 hours. After drying, the corona-treated film was heat sealed to the aluminum by maintaining the seal at 274° C. and 20 psi for 10 sec.

The commercial polyester bond was made by coating the corona-treated side of the film with commercial polyester adhesive solution (made of a condensation polymer formed by reaction of terephthalic acid, azelaic acid and ethylene glycol in 30% in methyl ethyl ketone containing 6 wt % of a curing agent, (which is 75% of the isocyanate condensate product made from 1 mole of trimethylol propane and 3 moles of toluene diisocyanate in ethyl acetate); and after air drying for about 10 minutes, the coating was dryed at 100° C. for ½ hour in a forced air oven. The film to film bonds were made by heat sealing at 107° C. for 2 min at 20 psi.

The commercial silicone bonds were made by coating corona treated film with commercial adhesive (which was a methyl phenyl polysiloxane resin solution of 55% resin, 36% mineral spirits and 9% toluene) and then drying and heat sealing film-to-film at 150° C.

The adhesive of this invention, used on this Example was a solution of 10 wt % of a vinylidene fluoride/hexafluoropropylene ($VF_2$/HFP) copolymer and 1 wt % of the same curing agent used above for the polyester adhesive, in tetrahydrofuran. The copolymer contained 60 wt.% vinylidene fluoride units and 40 wt. % hexafluoropropylene units and had a Mooney Viscosity of 32 to 44. The films were coated by using a wire-wound wet film application. After air drying, the coating was oven dried at 100° C. for ½ hr. A 5 mil film of uncured polymer was placed between the coated surfaces and then heat sealed at 150° C., 20 psi for 2 min.

Bond seal strengths were measured and the results are tabulated in the following table.

Films used were:

Film 1—a film of a copolymer of tetrafluoroethylene and hexafluoropropylene (3.6-3.8 wt % HFP, oriented by drawing 3.5X.

Film 2—a film of a copolymer of tetrafluoroethylene and perfluoro(propyl vinyl ether) (1.5 wt. % PFPVE), oriented by drawing 3.5 X.

Film 3—a film of a copolymer of ethylene/tetrafluoroethylene/perfluorobutylethylene (19 wt % ethylene and 3.5 wt. % PFBE), oriented by drawing 5.5X.

| Bond Seal Strength Machine Direction - lb/in (kg/cm) | | | |
|---|---|---|---|
| | Oriented Film | | |
| Adhesive | Film 1 | Film 2 | Film 3 |
| Polyester | 6.08 (1.09) | 5.21 (0.93) | 5.89 (1.05) |
| Silicone | 3.44 (0.61) | 3.35 (0.60) | 3.98 (0.21) |
| Acrylic | The bonds were too weak to measure* | | |
| $VF_2$/HFP Adhesive of this invention | 13.7 (2.45) | 13.1 (2.34) | 13.9 (2.48) |

This Example shows that the polyester, silicone and acrylic adhesives are not nearly as effective in bonding oriented films as the $VF_2$/HFP adhesive used in this invention.

EXAMPLE 2

A composite roll of film was made by splicing together the films identified as Films 1,2 and 3 in Example 1. The composite roll was corona treated in the presence of acetone as in Example 1 but using a power of 100 watts. Using the same strength test as in Example 1 and bonding procedures, the result shown in the attached table were obtained (machine direction).

| | Film 1 | | Film 2 | | Film 3 | |
|---|---|---|---|---|---|---|
| Adhesive | As Cast | Oriented | As Cast | Oriented | As Cast | Oriented |
| Acrylic | 7.6 | 1.4 | 5.5 | 0.56 | 7.3 | 0.31 |
| Polyester | 10.4 | 3.2 | 10.5 | 4.2 | 13.6 | 3.6 |
| Silicone | 4.4 | 3.7 | 4.6 | 3.7 | 4.8 | 4.2 |
| $VF_2$/HFP adhesive of this invention | 10.6 | 12.9 | 10.1 | 13.2 | 13.6 | 14.1 |

All numerical units are lb/in

This Example shows that the acrylic, polyester and silicone adhesives are less effective when used to bond oriented film than when used to bond cast film. On the contrary, the $VF_2$/HFP adhesive used in this invention is surprisingly more effective when used with oriented film.

EXAMPLE 3

Film 1, 2 and 3 of Example 1 were corona treated under conditions described in Example 1 except the power was increased to 150 watts. Film to printed circuit copper foil bonds were made using the $VF_2$/HFP adhesive used in Example 1. Using the same strength test and bonding procedure as in Example 1, the bond strengths were as follows: Film 1—12.2 lb/in, Film 2—11.3 lb/in and Film 3-13.4 lb/in.

I claim:

1. Process in which an oriented, melt-fabricable fluorocarbon copolymer film is laminated to another such film or to a substrate by first treating the surface of each film to be laminated to corona discharge in an atmosphere of acetone, then treating the surface of each such film with an adhesive mixture of A. 5–40% by weight of a copolymer of about 30 to 70% by weight of vinylidene fluoride units and complementally about 70 to 30% by weight of hexafluoropropene units, and B. 0.5–3% by weight of an isocyanate product made from 1 mole trimethylolpropane and 3 moles toluene diisocyanate in C. an organic solvent for both A and B;

and then pressing the coated film to another such coated film or to a substrate and heating for at least for 1.5 minutes at from 150° to 175° C. at a pressure of from 8 to 12 psi.

* * * * *